(12) United States Patent
Shue et al.

(10) Patent No.: US 9,269,609 B2
(45) Date of Patent: Feb. 23, 2016

(54) SEMICONDUCTOR ISOLATION STRUCTURE WITH AIR GAPS IN DEEP TRENCHES

(75) Inventors: Hong-Seng Shue, Zhubei (TW); Tai-I Yang, Hsin-Chu (TW); Wei-Ding Wu, Zhubei (TW); Ming-Tai Chung, Hsin-Chu (TW); Shao-Chi Yu, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 13/486,265

(22) Filed: Jun. 1, 2012

(65) Prior Publication Data

US 2013/0320459 A1 Dec. 5, 2013

(51) Int. Cl.
*H01L 21/70* (2006.01)
*H01L 21/762* (2006.01)
*H01L 21/768* (2006.01)
*H01L 29/06* (2006.01)
*H01L 21/764* (2006.01)

(52) U.S. Cl.
CPC ........ *H01L 21/76283* (2013.01); *H01L 21/764* (2013.01); *H01L 21/7682* (2013.01); *H01L 21/76264* (2013.01); *H01L 21/76289* (2013.01); *H01L 29/0649* (2013.01); *H01L 2221/1047* (2013.01)

(58) Field of Classification Search
USPC .................. 257/501, 506, 510, 522, E21.564, 257/E21.573, E21.581; 436/411, 421, 422, 436/619
See application file for complete search history.

(56) References Cited

U.S. PATENT DOCUMENTS

| | | | |
|---|---|---|---|
| 6,406,975 B1 | 6/2002 | Lim et al. | |
| 7,038,289 B2 | 5/2006 | Marty et al. | |
| 7,396,372 B2 | 7/2008 | Endoh et al. | |
| 7,400,024 B2 | 7/2008 | Kunnen | |
| 7,741,191 B2 * | 6/2010 | Frohberg et al. | 438/421 |
| 7,842,577 B2 * | 11/2010 | Fung | 438/296 |
| 8,575,680 B2 * | 11/2013 | Shin et al. | 257/316 |
| 2003/0098491 A1 | 5/2003 | Tsutsumi | |
| 2005/0139952 A1 | 6/2005 | Koh | |
| 2006/0131655 A1 | 6/2006 | Kunnen | |
| 2006/0197185 A1 * | 9/2006 | Chung | 257/552 |
| 2009/0236672 A1 * | 9/2009 | Harashima et al. | 257/390 |
| 2010/0019311 A1 * | 1/2010 | Sato et al. | 257/326 |
| 2010/0230741 A1 | 9/2010 | Choi et al. | |
| 2011/0062547 A1 * | 3/2011 | Onishi et al. | 257/510 |
| 2011/0175205 A1 | 7/2011 | Morii et al. | |
| 2011/0186918 A1 | 8/2011 | Sung | |
| 2011/0260294 A1 * | 10/2011 | Oh | 257/607 |
| 2012/0049266 A1 * | 3/2012 | Oh et al. | 257/316 |
| 2012/0146152 A1 * | 6/2012 | Dove | 257/368 |

FOREIGN PATENT DOCUMENTS

| KR | 1020050011498 | 1/2005 |
|---|---|---|
| KR | 1020050068896 | 7/2005 |
| KR | 1020090054739 | 6/2009 |

* cited by examiner

*Primary Examiner* — Thao X Le
*Assistant Examiner* — Gardner W Swan
(74) *Attorney, Agent, or Firm* — Slater & Matsil, L.L.P.

(57) ABSTRACT

A device includes a semiconductor substrate, a contact plug over the semiconductor substrate, and an Inter-Layer Dielectric (ILD) layer over the semiconductor substrate, with the contact plug being disposed in the ILD. An air gap is sealed by a portion of the ILD and the semiconductor substrate. The air gap forms a full air gap ring encircling a portion of the semiconductor substrate.

20 Claims, 9 Drawing Sheets

SEMICONDUCTOR ISOLATION STRUCTURE WITH AIR GAPS IN DEEP TRENCHES

BACKGROUND

In integrated circuit manufacturing processes, devices such as transistors are formed at the surfaces of semiconductor chips. The devices are isolated from each other by isolation regions. Shallow Trench Isolation (STI) regions are commonly used as the isolation regions to isolate active regions of the semiconductor substrate. Typically, STI regions are formed of a dielectric material or dielectric materials filled into trenches in semiconductor substrates.

The integrated circuits that adopt the STI regions still suffer from drawbacks, which include leakage currents at the junctions of p-type and n-type regions. For high-voltage devices, the conventional integrated circuits further suffer from low breakdown voltages and latch ups.

BRIEF DESCRIPTION OF THE DRAWINGS

For a more complete understanding of the embodiments, and the advantages thereof, reference is now made to the following descriptions taken in conjunction with the accompanying drawings, in which.

DETAILED DESCRIPTION OF ILLUSTRATIVE EMBODIMENTS

The making and using of the embodiments of the disclosure are discussed in detail below. It should be appreciated, however, that the embodiments provide many applicable inventive concepts that can be embodied in a wide variety of specific contexts. The specific embodiments discussed are illustrative, and do not limit the scope of the disclosure.

A deep trench isolation structure including an air gap therein and the methods of forming the same are provided in accordance with various exemplary embodiments. The intermediate stages of forming the deep trench isolation structure are illustrated. The variations of the embodiments are discussed. Throughout the various views and illustrative embodiments, like reference numbers are used to designate like elements.

Figure 1:
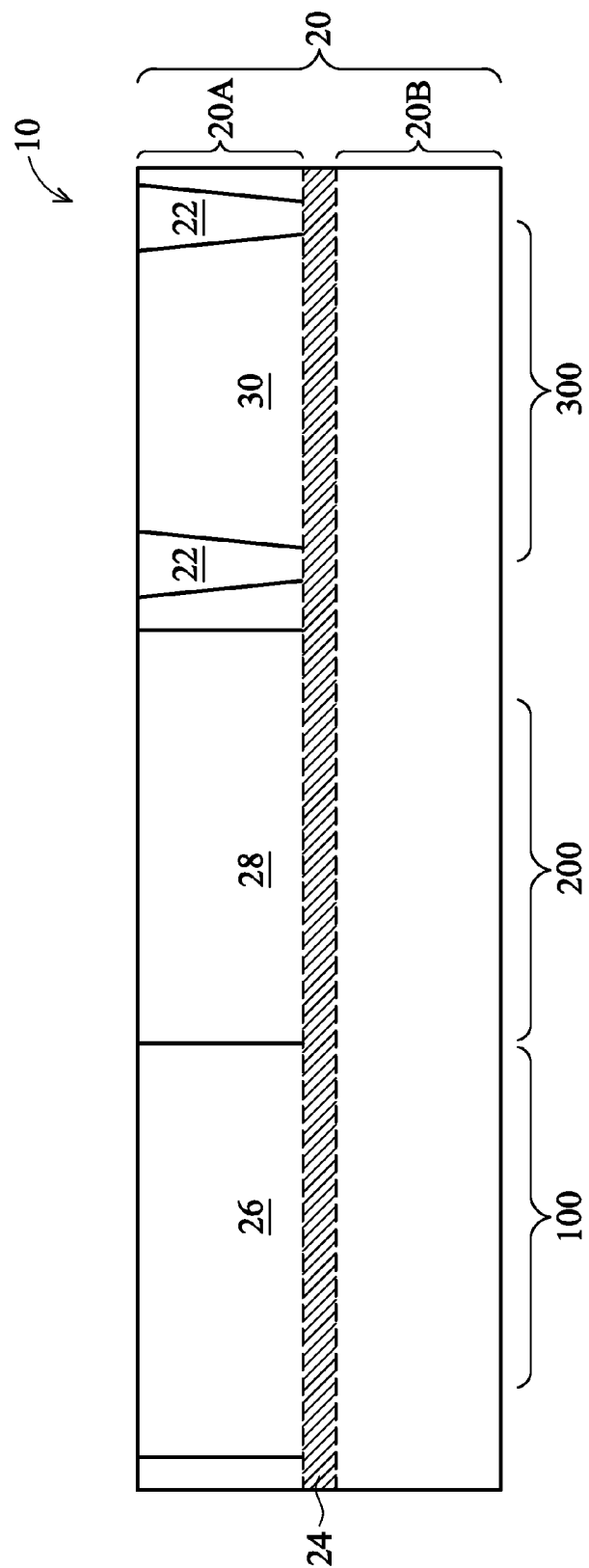
FIGS. 1 through 5 are cross-sectional views of intermediate stages in the manufacturing of Metal-Oxide-Semiconductor (MOS) devices and isolation regions in accordance with some exemplary embodiments, wherein the isolation regions include air gaps.

Referring to FIG. 1, wafer 10 is provided. Wafer 10 includes semiconductor substrate 20, which may comprise silicon, and may be a crystalline silicon substrate. Alternatively, other commonly used materials, such as carbon, germanium, gallium, arsenic, nitrogen, indium, phosphorus, and/or the like, may also be included in semiconductor substrate 20. Semiconductor substrate 20 may also comprise a III-V compound semiconductor material such as GaN, GaAs, or the like. In some embodiments, semiconductor substrate 20 is a bulk semiconductor substrate. In alternative embodiments, semiconductor substrate 20 is a Silicon-On-Insulator (SOI) substrate, which includes buried layer 24 disposed between upper semiconductor layer 20A and lower semiconductor layer 20B. Buried layer 24 may be a silicon oxide layer, and hence is referred to as buried oxide layer 24 hereinafter, although buried layer 24 may also be a non-oxide barrier layer formed by incorporating highly doped species into an intermediate layer of substrate 20 to form buried layer 24, for example through implantation.

Semiconductor substrate 20 includes a first portion in device region 100, a second portion in device region 200, and a third portion in device region 300. In some embodiments, device regions 100, 200, and 300 are different regions selected from the group consisting essentially of a high-voltage device region, a low-voltage device region, a logic core region, a memory region (such as a Static Random Access Memory (SRAM) region), an analog region, an input/output (TO) region, a p-type Metal-Oxide-Semiconductor (PMOS) device region, an n-type Metal-Oxide-Semiconductor (NMOS) device region, and the like. In some exemplary embodiments, region 300 is a low-voltage device region, and regions 100 and 200 are a high-voltage PMOS device region and high-voltage NMOS device region, respectively.

Further referring to FIG. 1, in some embodiments, Shallow Trench Isolation (STI) regions 22 are formed in device region 300, and extend from the top surface of substrate 20 into substrate 20. Device regions 100 and 200, however, may not include STI regions for isolating active regions and formed simultaneously as STI regions 22. In alternative embodiments, no STI regions 22 are formed in device region 300 for device isolation either. Instead, deep trenches 148 (FIG. 3) and air gaps (refer to air gaps 154 in FIG. 5) are formed for the device isolation in device region 300. Exemplary well regions, such as n-well region 26, p-well region 28, and well region 30, which may be a p-well region or an n-well region, are formed in regions 100, 200, and 300, respectively. In the embodiments that substrate 20 is an SOI substrate, well regions 26, 28, and 30 may extend to the top surface of buried oxide layer 24. In alternative embodiments, STI regions 22 may have bottoms higher than the top surface of buried oxide layer 24. In some exemplary embodiments, n-well 26, p-well region 28, and well region 30 have impurity concentrations between about $10^{14}/cm^3$ and about $10^{17}/cm^3$. It is appreciated, however, that the values recited throughout the description are merely examples, and may be changed to different values.

Figure 2:
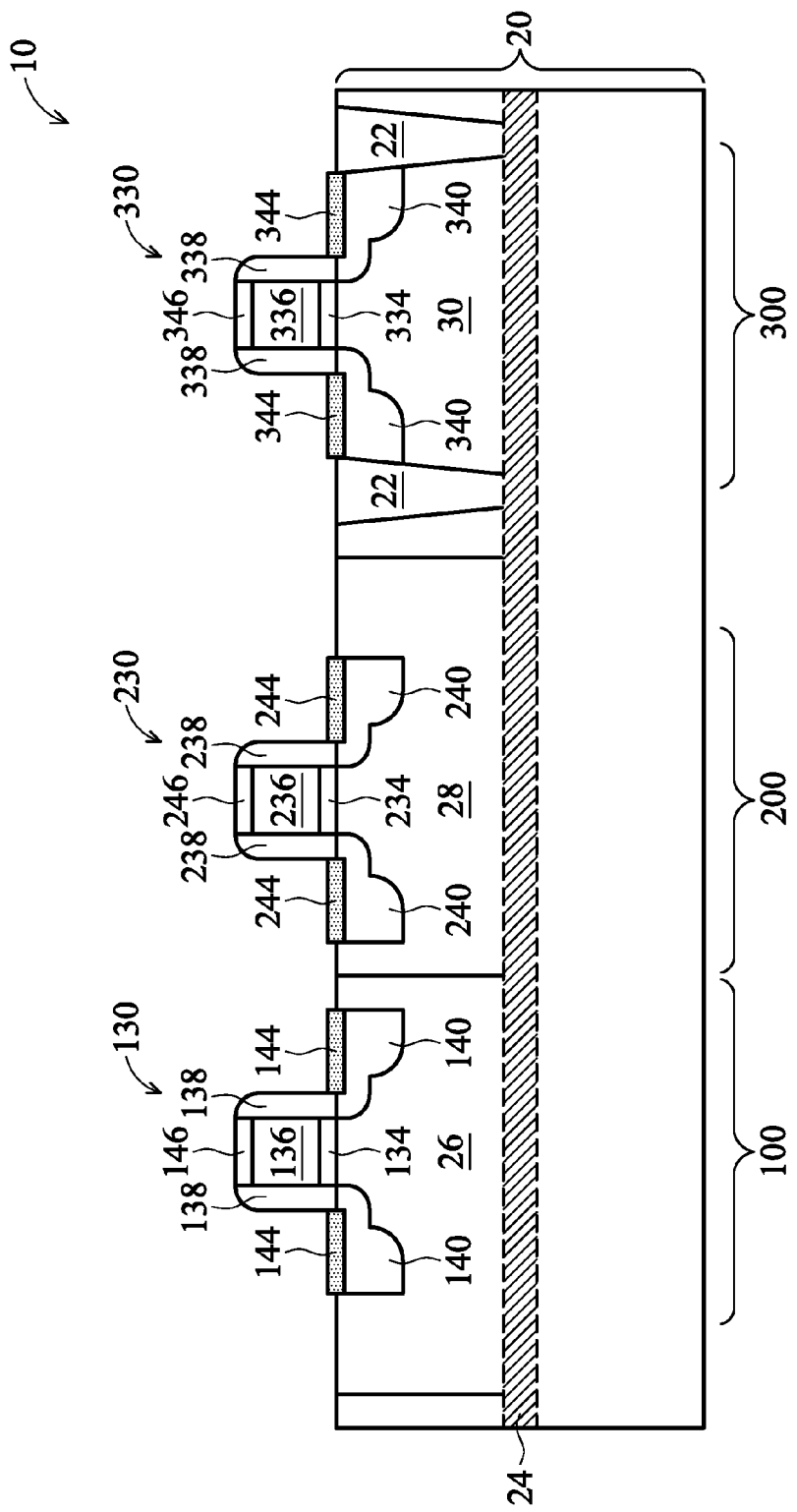

Referring to FIG. 2, Metal-Oxide-Semiconductor (MOS) devices 130, 230, and 330 are formed in device regions 100, 200, and 300, respectively. In some exemplary embodiments, MOS device 130 includes gate dielectric 134 over substrate 20, gate electrode 136 over gate electrode 134, and gate spacers 138 on the sidewalls of gate electrode 136. Source and drain regions (referred to as source/drain regions hereinafter) 140 are formed on the opposite sides of gate electrode 136. Furthermore, source and drain extension regions 142 may be formed. MOS device 230 may include gate dielectric 234, gate electrode 236, gate spacers 238, source/drain regions 240, source/drain extension regions 242, and the like. In the embodiments wherein MOS devices 130 and 230 are high-voltage MOS devices, there may further be isolation regions (not shown, such as field oxides or STI regions) on the drain side of the respective MOS devices 130 and 230. The isolation regions may extend under gate electrodes 136 and 236 and spaces drain regions 140/240 apart from the respective gate electrodes 136/236. MOS devices 130 and 230 may be operated under drain voltages higher than about 5 volts, higher than about 50 volts, or higher than above 100 volts, for example, without incurring the breakdown of MOS devices 130 and 230. In some embodiments, MOS devices 130 and 230 are an NMOS device and a PMOS device, respectively.

MOS device 330 may include gate dielectric 334, gate electrode 336, gate spacers 338, source/drain regions 340, source/drain extension regions 342, and the like. In some embodiments, MOS device 330 has a structure different from the structures of MOS devices 130 and 230. For example, MOS device 330 may be a low-voltage MOS device, wherein the operation range of the respective drain voltage may be lower than about 5 volts, for example, without causing the breakdown of MOS device 330. When the drain voltage applied to the drain of MOS device 330 is higher than the operation range, however, MOS device 330 may break down.

In some exemplary embodiments, gate dielectrics 134, 234, and 334 comprise silicon dioxide. Alternatively, gate dielectrics 134, 234, and 334 comprise high-k dielectric materials, silicon oxynitride, silicon nitride, or combinations thereof. The high-k materials may be selected from metal oxides, metal nitrides, metal silicates, transition metal-oxides, transition metal-nitrides, transition metal-silicates, oxynitrides of metals, metal aluminates, zirconium silicate, zirconium aluminate, hafnium oxide, or combinations thereof. Gate dielectrics 134, 234, and 334 may be formed using Chemical Vapor Deposition (CVD), Atomic Layer Deposition (ALD), thermal oxide, other suitable processes, or combinations thereof.

Gate electrodes 136, 236, and 336 may comprise polycrystalline silicon (polysilicon). Alternatively, gate electrodes 136, 236, and 336 comprise a metal or a metal silicide such as Al, Cu, Co, Mo, Ni, W, Ti, Ta, TiN, TaN, NiSi, NiPtSi, CoSi, or combinations thereof. The formation methods of gate electrodes 136, 236, and 336 include CVD, Physical Vapor Deposition (PVD), ALD, and the like. The formation of gate dielectrics 134, 234, and 334 and gate electrodes 136, 236, and 336 may include forming a blanket dielectric layer and a blanket gate electrode layer, and then performing a patterning step.

Source/drain regions 140, 240, and/or 340 may be formed by implantations, or may be formed by recessing into semiconductor substrate 20 to form recesses, and then epitaxially growing source/drain regions 140, 240, and/or 340 in the respective recesses. Source/drain regions 140, 240, and 340 may have a p-type or an n-type impurity concentration between about $10^{19}/cm^3$ and about $10^{21}/cm^3$, for example, depending on the conductivity types of MOS devices 130, 230, and 330, respectively.

Source/drain silicide regions 144, 244, and 344 are formed on source/drain regions 140, 240, and 340, respectively. In the embodiments wherein gate electrodes 136, 236, and 336 comprise silicon, gate silicide regions 146, 246, and 346 may also be formed. The formation of silicide regions 144, 244, 344, 146, 246, and 346 may include a self-aligned silicide (salicide) process. The silicide process includes blanket depositing a metal layer (not shown) after the formation of source/drain regions 140, 240, and 340, followed by an anneal to cause the reaction between the metal layer and the underlying silicon. Silicide regions 144, 244, 344, 146, 246, and 346 are thus formed. The metal layer may include nickel, cobalt, or the like. The unreacted portion of the metal layer is then removed.

Figure 3:
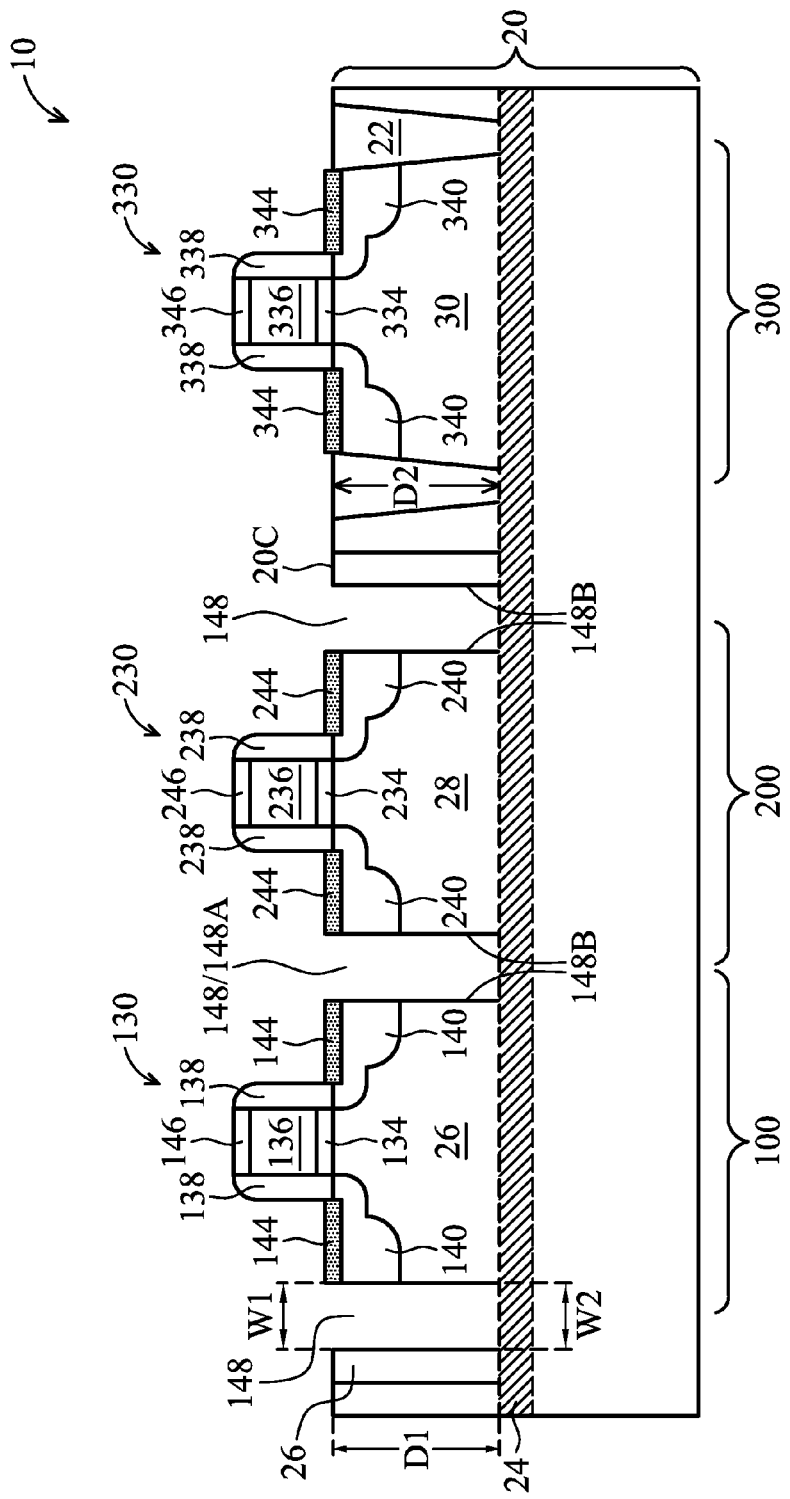

FIG. 3 illustrates the formation of deep trenches 148, which is formed by etching semiconductor substrate 20. In the embodiments wherein semiconductor substrate 20 is a bulk substrate, deep trenches 148 may have depth D1 substantially equal to, or greater than, the depth of P-well region 26 and N-well region 28. Depth D1 may be between about two times and about five times, or may be between about two times and about ten times, height D2 of STI regions 22, depending on the operation voltage of the respective MOS devices 130 and 230. In the embodiments substrate 20 is an SOI substrate, deep trenches 148 may extend to buried oxide 24, and hence buried oxide 24 is exposed to deep trenches 148. One of deep trenches 148 (marked as 148A) may be formed at the interface area of P-well region 26 and N-well region 28. Accordingly, after the formation of deep trenches 148, the sidewalls of both P-well region 26 and N-well region 28 are exposed to deep trench 148A. Deep trench 148A thus acts as the isolation structure of P-well region 26 and N-well region 28.

Deep trenches 148 may be adjacent to source/drain regions 140 and 240 and source/drain silicide regions 144 and 244. In some embodiments, the sidewalls of source/drain regions 140 and 240 and source/drain silicide regions 144 and 244 are exposed to deep trenches 148. Accordingly, the sidewalls of source/drain regions 140 and 240 and source/drain silicide regions 144 and 244 may be exposed to deep trenches 148. In alternative embodiments, deep trenches 148 may be spaced apart from source/drain regions 140 and 240 and source/drain silicide regions 144 and 244, for example, by portions of the respective P-well region 26 and N-well region 28.

Deep trenches 148 may be formed using Reactive Ion Etching (RIE), Deep Reactive Ion Etching (DRIE), or the like. The formation of deep trenches 148 may include a plurality of etch/deposition cycles, which is known in the DRIE process. In some embodiments, the etch for forming deep trenches 148 includes the using of a plasma source, which is an Inductively Coupled Plasma (ICP) source. Alternatively, the plasma for the etch may be generated form a Transformer Coupled Plasma (TCP). Sidewall 148B of deep trenches 148 form angle α with the respective bottom surface 148C in the same one of deep trenches 148. Angle α may be a sharp angle small than 90 degrees, for example, between about 70 degrees and 90 degrees. Angle α may also be equal to or slightly greater than 90 degrees. For example, angle α may be between about 90 degrees and about 95 degrees.

Figure 4:
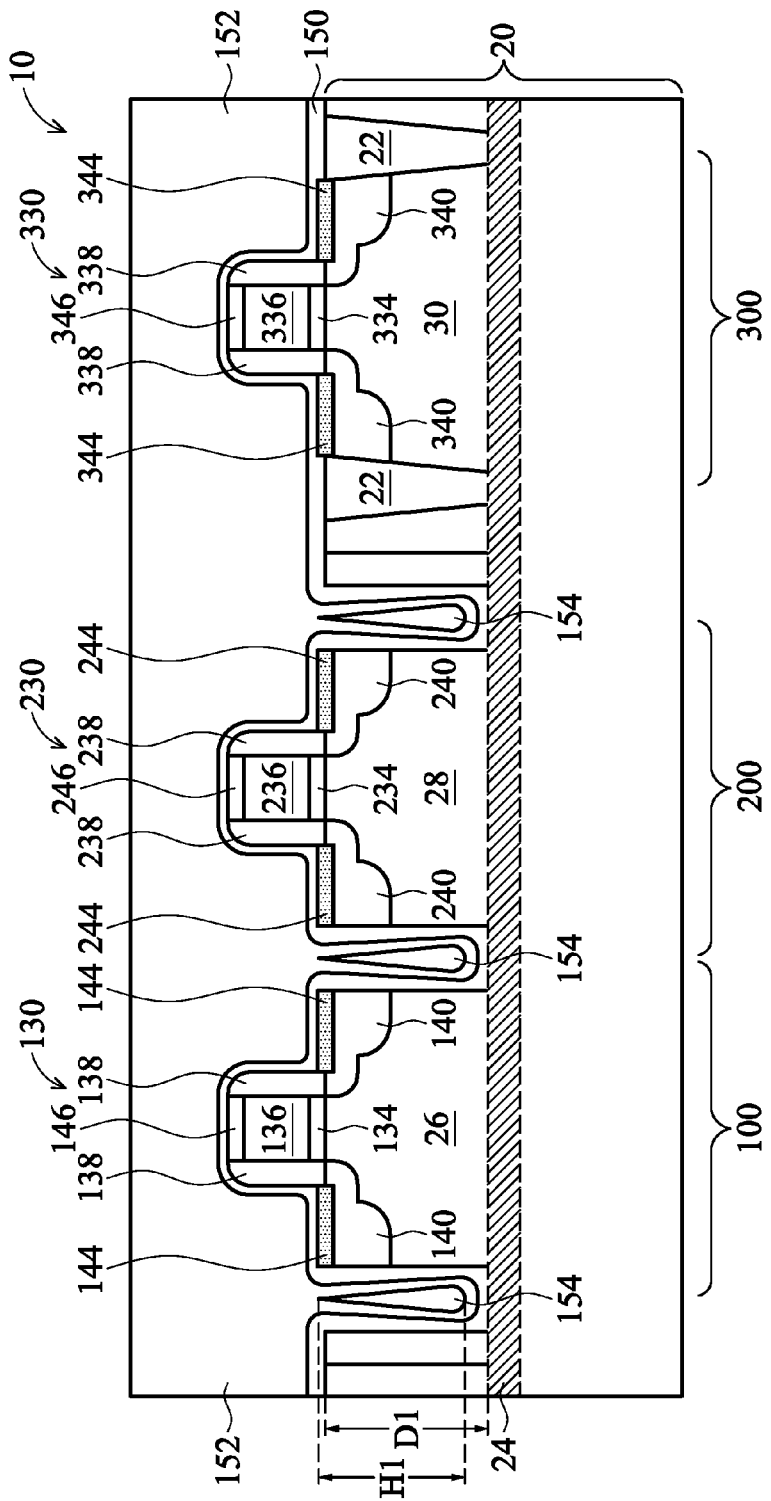

FIG. 4 illustrates the formation of one dielectric layer or a plurality of dielectric layers. In accordance with some embodiments, the dielectric layers include inter-Layer Dielectrics (ILD) 150 and 152, which cover the top and sidewalls of MOS devices 130, 230, and 330. Throughout the description, although the formed dielectric layers are referred to as ILD 150 and 152, they may also include Inter-Metal Dielectric (IMD) layers, which are used for forming metal lines therein. In some embodiments, ILD 150 is also referred to as a Contact Etch Stop Layer (CESL), which is used to stop the etching of the overlying ILD 152 in the formation of contact openings. In alternative embodiments, ILDs 150 and 152 are in combination referred to as a composite ILD. ILDs 150 and 152 may be formed of different materials. For example, ILD 150 may be formed of dielectric materials such as silicon oxide, silicon nitride, or combinations thereof. ILD 152 may be formed of an oxide such as Phospho-Silicate glass (PSG), Boro-Silicate Glass (BSG), Boron-Doped Phospho-Silicate Glass (BPSG), Tetraethyl Orthosilicate (TEOS) oxide, or the like. ILD 152 may have its top surfaces higher than the top surfaces of gate silicide regions 146, 246, and 346. In some embodiments, ILDs 150 and 152 are formed using a Chemical Vapor Deposition (CVD) method such as Plasma Enhanced Chemical Vapor Deposition (PECVD), Sub-Atmospheric Chemical Vapor Deposition (SACVD, or the like.

As a result of the formation of ILDs 150 and 152, air gaps 154 are formed in deep trenches 148. The volumes of the air gaps 154 may be between about 0.3 times and about 0.9 times the volumes of the respective deep trenches 148, wherein the volumes of air gaps 154 affect the insulating capability of the respective MOS devices 130 and 230. In some embodiments, ILDs 150 and 152 comprise portions formed on the sidewalls of deep trenches 148. The portions of ILDs 150 and/or 152 may, or may not, cover the sidewalls of deep trenches 148. Accordingly, in some embodiments, portions of sidewalls of semiconductor substrate 20 are exposed to air gaps 154, as shown in FIG. 5A. In other embodiments, ILD 150 fully seals air gaps 154, and hence ILD 152 does not have substantial portions extending into deep trenches 148. In yet other embodiments, both ILDs 150 and 152 comprise portions formed on the sidewalls and the bottoms of deep trenches 148, and the center portions of deep trenches 148 form air gaps 154. Air gaps 154 may either be vacuumed or filled with air, which may contain the chemical species of the ambient during ILD deposition. ILD 152 may, or may not, continuously extend from outside of trenches 148 to inside trenches 148. In some embodiments, height H1 of air gaps 154 is greater than about 50 percent, 80 percent, or 90 percent, depth D1 of deep trenches 148. The formation of vertical or reversed trapezoid shape of deep trenches 148 may help seal trenches 148 early, and the volume of air gaps 154 may be increased.

In some embodiments, the cross-sectional shape of air gaps 154 may be similar to water drops (or so called the tear shape). The top ends of air gaps 154 may be higher than the top surface of the semiconductor substrate by a difference between about 20 nm and about 50 nm. The difference may also be as great as about 150 nm, depending on the thickness of the ILDs 150 and 152 and the deposition method for forming ILDs 150 and 152. Alternatively, the top ends of air gaps 154 may be lower than the top surface of the semiconductor substrate by a difference about 20 nm and about 150 nm. The difference may also be as great as about 250 nm, depending on the thickness of the ILDs 150 and 152 and the deposition method for forming ILDs 150 and 152.

Figure 5:
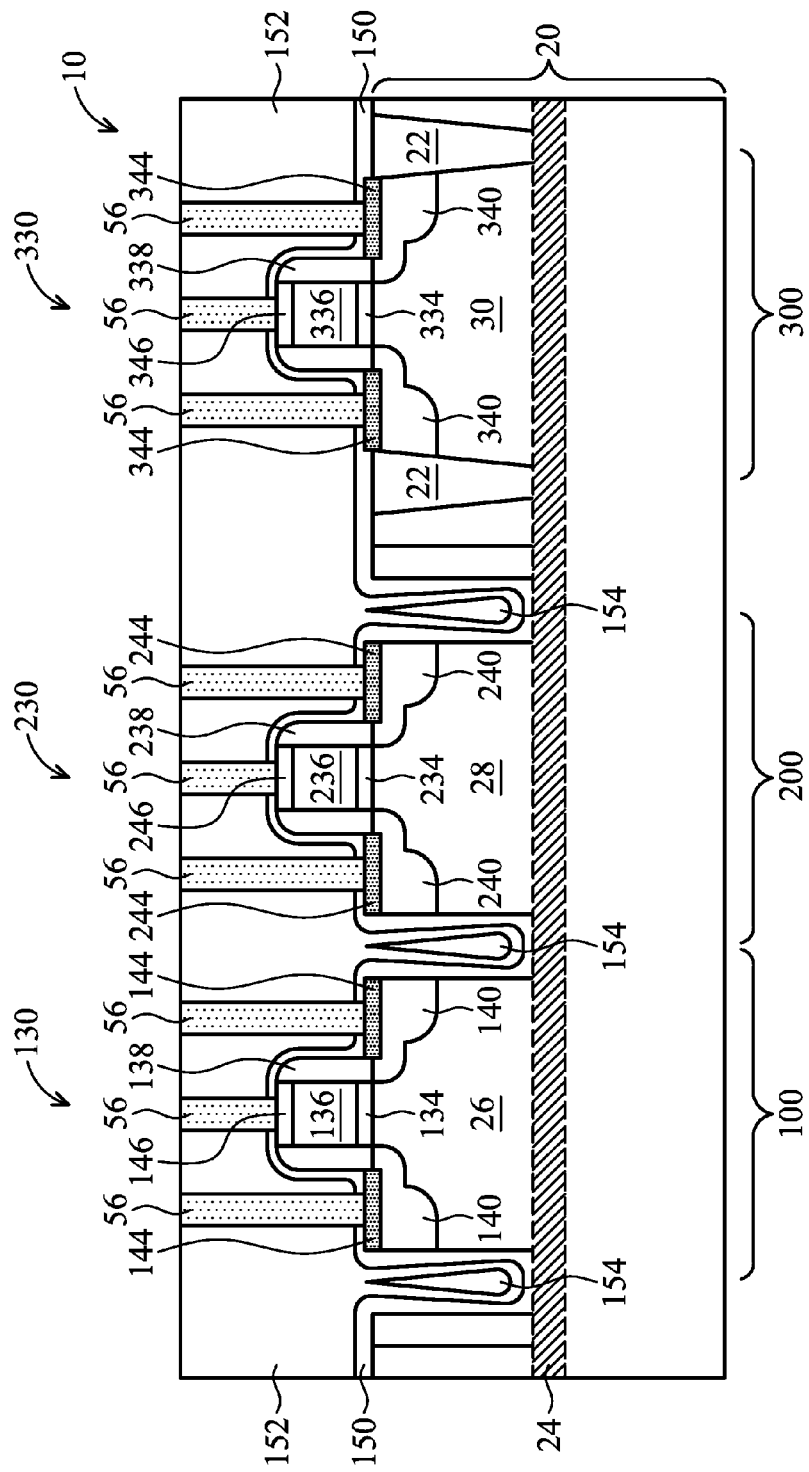
Figure 5A:
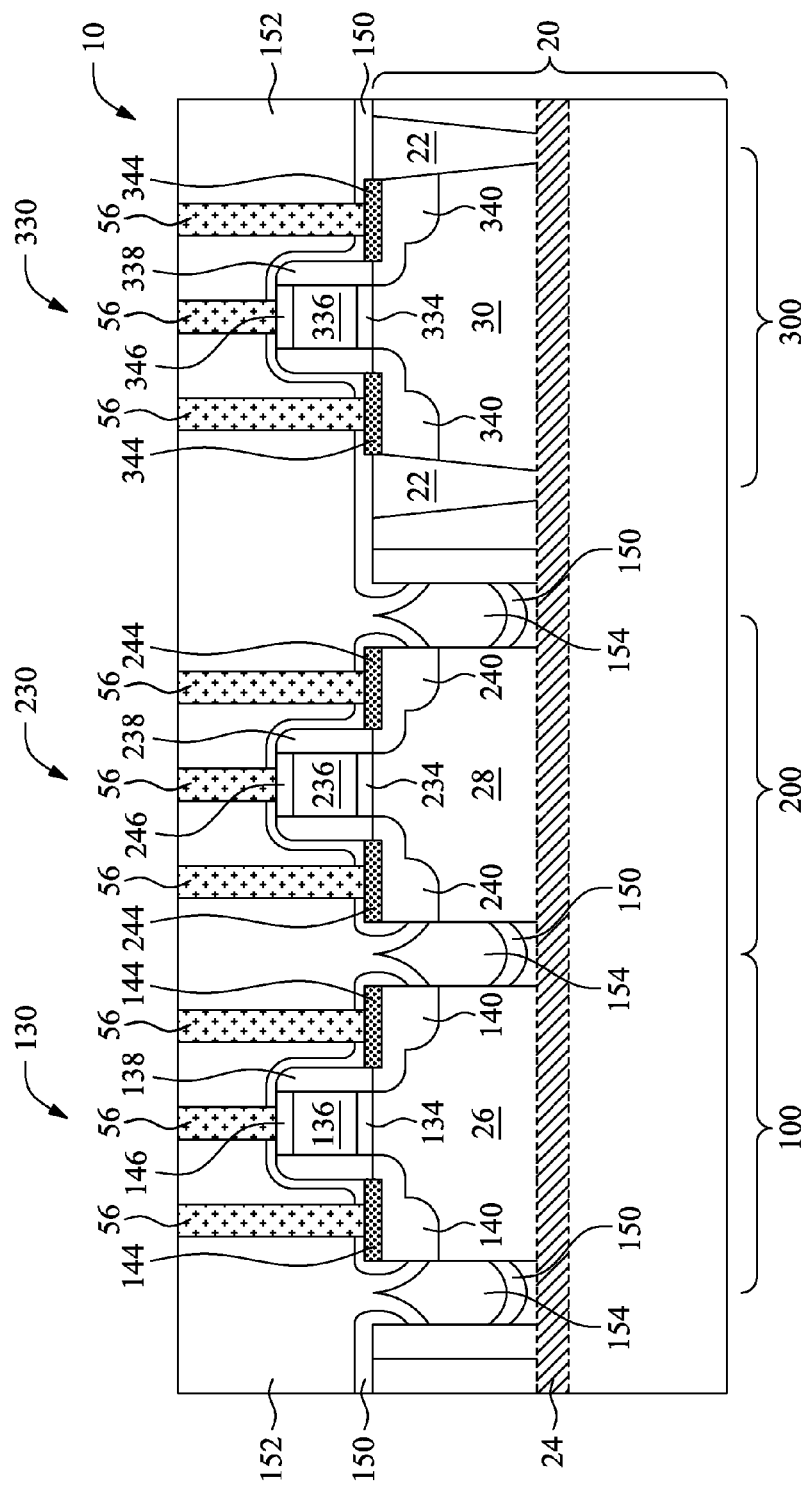
FIG. 5A illustrates a cross-sectional view of a MOS device and isolation regions in accordance with some embodiments.

FIG. 5 illustrates the formation of contact plugs 56 in ILDs 150 and 152. In some embodiments, contact plugs 56 comprise tungsten, aluminum, copper, titanium, tantalum, or alloys thereof. The formation process may include etching ILDs 150 and 152 to form contact openings, and then filling the contact openings with a conductive material. A Chemical Mechanical Polish (CMP) is then performed to remove excess portions of the conductive material that are over ILD 152. The remaining portions of the conductive material form contact plugs 56.

Figure 6:
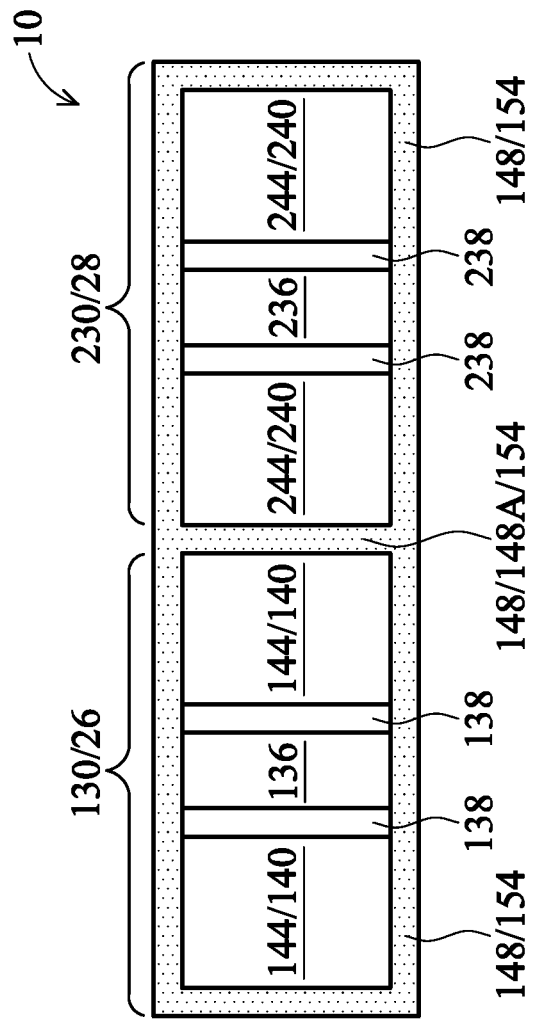
FIG. 6 illustrates a top view of a portion of the structure in FIG. 5.

FIG. 6 illustrates an exemplary top view of portions the devices in FIG. 5, wherein MOS devices 130 and 230 are illustrated. It is appreciated that deep trenches 148 and air gaps 154 may form full rings encircling MOS devices 130 and 230. Furthermore, deep trench 148A (and the respective air gap 154 therein) may be located between MOS devices 130 and 230, and isolate P-well region 26 from N-well region 28. Accordingly, air gaps 154 may prevent a junction being formed between P-well region 26 from N-well region 28, and hence has the effect of reducing leakage currents. Furthermore, when MOS devices 130 and 230 are formed of high-voltage devices, air gaps 154 have a high breakdown voltage, and hence any high voltage applied to circuit components inside air gap 154 is isolated from the circuit components outside air gap 154.

Figure 7A:
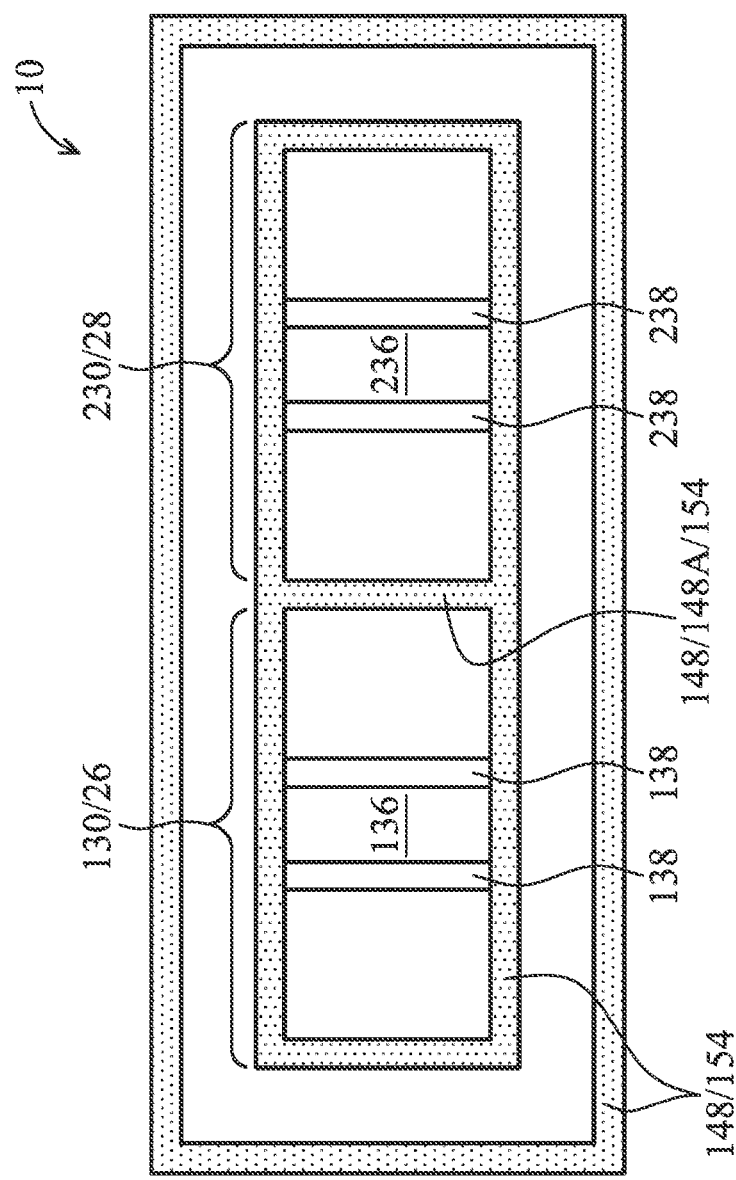
FIGS. 7A and 7B illustrate a top view and a cross-sectional view, respectively, of a device, wherein one deep trench is formed to encircle another deep trench.
Figure 7B:
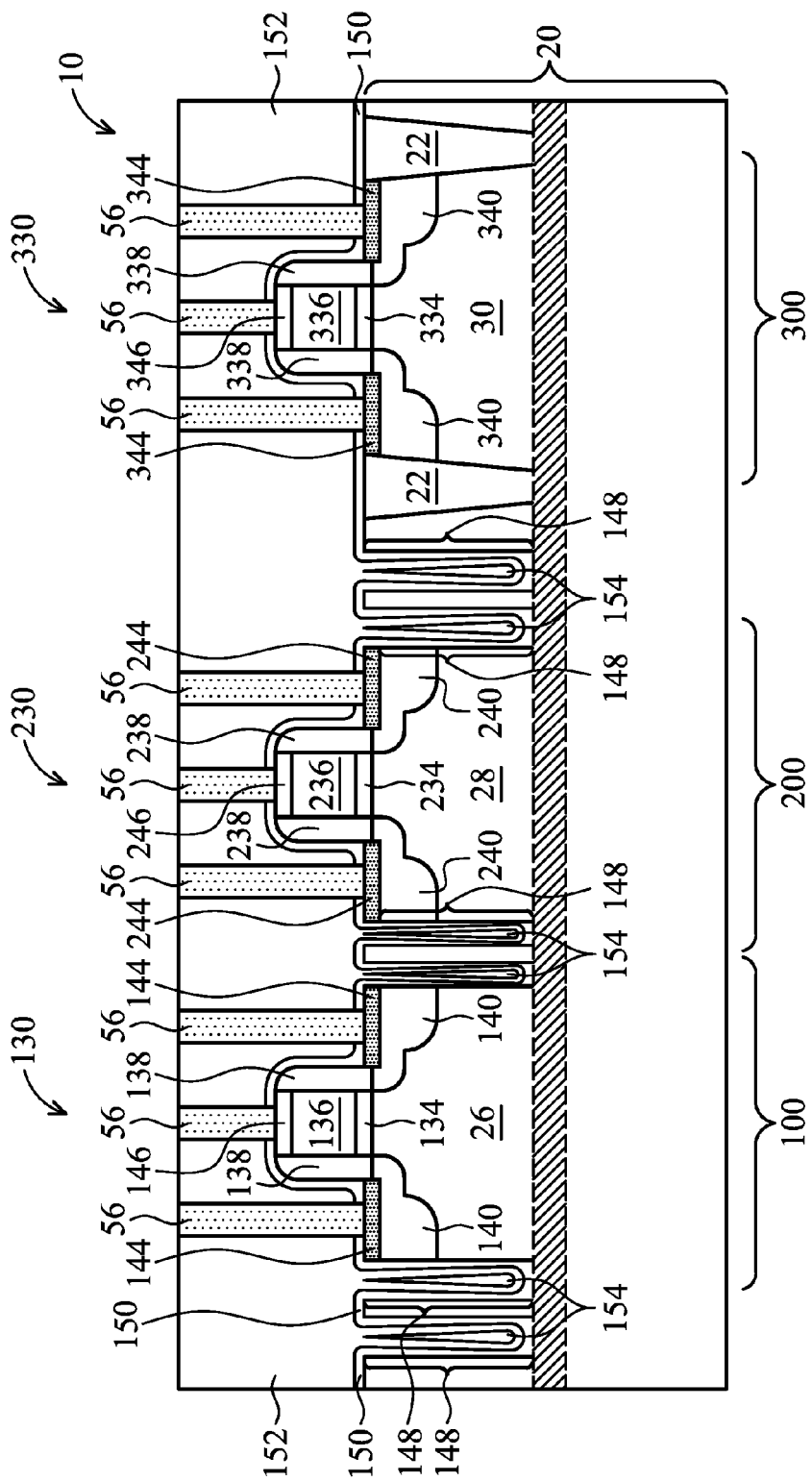

FIGS. 7A and 7B illustrate a top view and a cross-sectional view, respectively, of a device, wherein deep trenches 148 are encircled by another deep trench 148. Referring to FIG. 7A, each of MOS devices 130 and 230 are encircled by one of deep trenches 148. Furthermore, another deep trench 148 is formed to encircle both MOS devices 130 and 230 and the corresponding encircling deep trenches 148. In some embodiments, as shown in FIG. 7B, between MOS devices 130 and 230, there are two deep trenches 148, or a single deep trench 148.

Referring back to FIG. 5, in accordance with some embodiments, on the same wafer 10, both STI regions 22 and air gaps 154 are formed as isolation regions. STI regions 22 may be used as the isolation regions of low-voltage devices, and air gaps 154 may be used as the isolation regions of high-voltage devices. In alternative embodiments, no STI regions are formed in wafer 10. Instead, air gaps 154 are formed where STI regions 22 are formed.

Although FIG. 5 illustrates that air gaps 154 act as the isolation structures adjacent to, or encircling, MOS devices. It is appreciated that air gaps 154 may act as the isolation regions of other devices including, and not limited to, diodes, capacitors, resistors, and the like.

Air gaps 154 have higher breakdown voltages than STI regions. Experiment results indicated that the breakdown voltages of air gaps are higher than the breakdown voltage of metal lines in metal layers by greater than about 470V, indicating that the breakdown voltages of air gaps are high enough, so that they are not bottle necks in the reliability improvement of the integrated circuits.

In accordance with embodiments, a device includes a semiconductor substrate, a contact plug over the semiconductor substrate, and an Inter-Layer Dielectric (ILD) over the semiconductor substrate, with the contact plug being disposed in the ILD. An air gap is sealed by a portion of the ILD and the semiconductor substrate. The air gap includes at least a portion at a same level as a top portion of the semiconductor substrate.

In accordance with other embodiments, a device includes semiconductor substrate, a deep trench extending from a top surface of the semiconductor substrate into the semiconductor substrate, and a MOS device at the top surface of the semiconductor substrate. The MOS device includes a gate electrode over the semiconductor substrate, a source/drain region adjacent the gate electrode and the deep trench, and a source/drain silicide region over the source/drain region. An ILD is disposed over the gate electrode and the source/drain silicide region. The ILD further extends into the deep trench, and seals an air gap in the deep trench.

In accordance with yet other embodiments, a method includes forming a MOS device at a top surface of a semiconductor substrate. After the step of forming the MOS device, a deep trench is formed in the semiconductor substrate. An ILD is formed over the MOS device, wherein the ILD extends into the deep trench, and seals an air gap in the deep trench.

Although the embodiments and their advantages have been described in detail, it should be understood that various changes, substitutions and alterations can be made herein without departing from the spirit and scope of the embodiments as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A device comprising:
a semiconductor substrate;
a first Metal-Oxide-Semiconductor (MOS) device at a top surface of the semiconductor substrate;
a second MOS device at the top surface of the semiconductor substrate;
a first trench extending into the semiconductor substrate from the top surface of the semiconductor substrate, the first trench including a first portion, a second portion, and a third portion, wherein:
the first portion of the first trench surrounds the first MOS device and the second MOS device,
the second portion of the first trench extends between the first MOS device and the second MOS device, the second portion of the first trench being contiguous with the first portion of the first trench, and
the third portion of the first trench extends between the first MOS device and the second MOS device, the third portion of the first trench being contiguous with the first portion of the first trench, the second portion of the first trench being separated from the third portion of the first trench in a direction from the first MOS device to the second MOS device by a portion of the semiconductor substrate;
an Inter-Layer Dielectric (ILD) layer over the semiconductor substrate and extending into the first trench, wherein a first air gap is sealed in the first trench by the ILD layer, wherein at least a portion of the first air gap is disposed in the first trench below the top surface of the semiconductor substrate, wherein the semiconductor substrate along a first semiconductor sidewall of the first trench contacts the first air gap, and wherein the first air gap is contiguous through the first portion of the first trench, the second portion of the first trench, and the third portion of the first trench; and
a contact plug through the ILD and connected to at least one of the first MOS device and the second MOS device.

2. The device of claim 1, further comprising:
wherein the first MOS device comprises:
a first gate electrode over the semiconductor substrate; and
a first source/drain region in the semiconductor substrate and adjacent the first gate electrode, the second portion of the first trench being adjacent to the first source/drain region, and
wherein the second MOS device comprises:
a second gate electrode over the semiconductor substrate; and
a second source/drain region in the semiconductor substrate and adjacent the second gate electrode, the third portion of the first trench being adjacent to the second source/drain region, wherein the ILD layer extends over the first gate electrode, the second gate electrode, the first source/drain region, and the second source/drain region.

3. The device of claim 2 further comprising:
a first source/drain silicide region over the first source/drain region; and
a second source/drain silicide region over the second source/drain region, wherein the ILD layer comprises a portion overlapping the first source/drain silicide region and the second source/drain silicide region.

4. The device of claim 1 further comprising:
a low-voltage MOS device at the top surface of the semiconductor substrate, wherein each of the first MOS device and the second MOS device is a high-voltage MOS device; and
a Shallow Trench Isolation (STI) region extending into the semiconductor substrate, wherein the STI region forms a ring encircling the low-voltage MOS device, and wherein the high-voltage MOS device has a breakdown voltage higher than a breakdown voltage of the low-voltage MOS device.

5. The device of claim 1, wherein the ILD layer contacts a top surface of the portion of the semiconductor substrate separating the second portion of the first trench and the third portion of the first trench in the direction from the first MOS device to the second MOS device.

6. The device of claim 1 further comprising a second trench extending into the semiconductor substrate from the top surface of the semiconductor substrate and surrounding the first trench, wherein the ILD layer extends into the second trench, and a second air gap is sealed in the second trench by the ILD layer, wherein at least a portion of the second air gap is disposed in the second trench below the top surface of the semiconductor substrate, wherein the second air gap forms a full air gap ring encircling the first trench.

7. A device comprising:
a semiconductor substrate;
a first Metal-Oxide-Semiconductor (MOS) device at a top surface of the semiconductor substrate, wherein the first MOS device comprises:
a first gate electrode over the semiconductor substrate; and
a first source/drain region in the semiconductor substrate and adjacent the first gate electrode;
a second MOS device at the a top surface of the semiconductor substrate, wherein the second MOS device comprises:
a second gate electrode over the semiconductor substrate; and
a second source/drain region in the semiconductor substrate and adjacent the second gate electrode;
a first trench extending from the top surface of the semiconductor substrate into the semiconductor substrate, the first trench including:
a first portion of the first trench surrounding the first MOS device and the second MOS device,
a second portion of the first trench extending between the first source/drain region and the second source/drain region, the second portion of the first trench being contiguous with the first portion of the first trench, the second portion of the first trench being adjacent to the first source/drain region, and
a third portion of the first trench extending between the first source/drain region and the second source/drain region, the third portion of the first trench being contiguous with the first portion of the first trench, the third portion of the first trench being adjacent to the second source/drain region, the second portion of the first trench being separated from the third portion of the first trench in a direction from the first source/drain region to the second source/drain region by a portion of the semiconductor substrate; and
an Inter-Layer Dielectric (ILD) layer comprising:
a lower portion over and physically contacting the first gate electrode, the second gate electrode, the first source/drain region, and the second source/drain region, the lower portion further extending into the first trench and along sidewalls of the first trench, and an upper portion over the lower portion, wherein the lower portion and the upper portion comprise different materials, the upper portion extending into the first trench, wherein the upper portion seals a first air gap in the first trench, with all portions of the ILD layer exposed to the first air gap being portions of the upper portion, and wherein the first air gap is contiguous through the first portion of the first trench, the second portion of the first trench, and the third portion of the first trench.

8. The device of claim 7, wherein substantially an entirety of the first air gap is below the top surface of the semiconductor substrate.

9. The device of claim 7 further comprising a shallow trench isolation region in the semiconductor substrate having a height, wherein the first trench has a thickness ranging between about two times and about ten times the height of the shallow trench isolation region.

10. The device of claim 7, wherein each of the first MOS device and the second MOS device is a high-voltage MOS device, and wherein the device further comprises:
a low-voltage MOS device at the top surface of the semiconductor substrate; and
a Shallow Trench Isolation (STI) region extending into the semiconductor substrate, wherein the STI region forms a ring encircling the low-voltage MOS device, and wherein the high-voltage MOS device has a breakdown voltage higher than a breakdown voltage of the low-voltage MOS device.

11. The device of claim 7, wherein the lower portion of the ILD layer contacts respective sidewalls of the first source/drain region and the second source/drain region.

12. The device of claim 7, wherein the first source/drain region comprises a first source/drain silicide, and the second source/drain region comprises a second source/drain silicide, the lower portion of the ILD being over and physically contacting the first source/drain silicide and the second source/drain silicide.

13. The device of claim 7, wherein the ILD layer contacts a top surface of the portion of the semiconductor substrate separating the second portion of the first trench and the third portion of the first trench in the direction from the first MOS device to the second MOS device.

14. The device of claim 7 further comprising a second trench extending from the top surface of the semiconductor substrate into the semiconductor substrate and surrounding the first trench, wherein the lower portion of the ILD layer extends into the second trench and along sidewalls of the second trench, the upper portion of the ILD layer extends into the second trench and seals a second air gap in the second trench, wherein the second air gap forms a full air gap ring encircling the first trench.

15. A device comprising:
a semiconductor substrate;
a first Metal-Oxide-Semiconductor (MOS) device at a top surface of the semiconductor substrate, wherein the first MOS device comprises a first gate electrode and a first source/drain region;
a second MOS device at the top surface of the semiconductor substrate, wherein the second MOS device comprises a second gate electrode and a second source/drain region;

a trench extending from the top surface of the semiconductor substrate into the semiconductor substrate, the trench including a first portion, a second portion, and a third portion, wherein:
the first portion of the trench surrounds the first MOS device and the second MOS device,
the second portion of the trench extends between the first source/drain region and the second source/drain region, the second portion of the trench being adjacent to the first source/drain region, the second portion of the trench being contiguous with the first portion of the trench, and
the third portion of the trench extends between the first source/drain region and the second source/drain region, the third portion of the trench being adjacent to the second source/drain region, the third portion of the trench being contiguous with the first portion of the trench, the second portion of the trench being separated from the third portion of the trench in a direction from the first source/drain region to the second source/drain region by a portion of the semiconductor substrate; and
an Inter-Layer Dielectric (ILD) layer comprising a first layer over and physically contacting the first gate electrode, the second gate electrode, the first source/drain region, and the second source/drain region and along and physically contacting a sidewall of the trench, wherein the ILD layer further comprises a second layer extending into the trench, the first layer and the second layer comprising different materials, the ILD layer sealing an air gap in the trench, with all portions of the ILD layer exposed to the air gap being portions of the second layer, wherein at least a portion of the air gap is below the top surface of the semiconductor substrate, and wherein the air gap is contiguous through the first portion of the trench, the second portion of the trench, and the third portion of the trench.

16. The device of claim 15, wherein a top end of the air gap projects above the top surface of the semiconductor substrate.

17. The device of claim 15, wherein a top end of the air gap is disposed below the top surface of the semiconductor substrate.

18. The device of claim 15, wherein a volume of the air gap is between about 0.3 to about 0.9 times a volume of the trench.

19. The device of claim 15, wherein a depth of the trench is between about 2 to about 10 times a height of a laterally adjacent shallow trench isolation region.

20. A structure comprising:
a semiconductor substrate;
a first device at a top surface of the semiconductor substrate, the first device comprising a first gate electrode over the top surface of the semiconductor substrate and a first source/drain region in the semiconductor substrate;
a second device at the top surface of the semiconductor substrate, the second device comprising a second gate electrode over the top surface of the semiconductor substrate and a second source/drain region in the semiconductor substrate;
a first trench extending from the top surface of the semiconductor substrate into the semiconductor substrate, the first trench including:
a first portion of the first trench surrounding the first device and the second device,
a second portion of the first trench extending between the first source/drain region and the second source/drain region and being adjacent to the first source/ drain region, the second portion of the first trench being contiguous with the first portion of the first trench, and a third portion of the first trench extending between the first source/drain region and the second source/drain region and being adjacent to the second source/drain region, the third portion of the first trench being contiguous with the first portion of the first trench, the second portion of the first trench being separated from the third portion of the first trench in a direction from the first source/drain region to the second source/drain region by a portion of the semiconductor substrate;

a second trench extending from the top surface of the semiconductor substrate into the semiconductor substrate and surrounding the first trench;

a first ILD layer conformally over and contacting the first gate electrode and the second gate electrode, over and contacting the first source/drain region and the second source/drain region, and in the first trench and the second trench, the first ILD layer contacting a first semiconductor sidewall and a second semiconductor sidewall of the first trench;

a second ILD layer over the first ILD layer, wherein:

the first ILD layer is a material different from the second ILD layer, the second ILD layer extends into the first trench and seals a first air gap in the first trench, and at least a portion of the first air gap is below the top surface of the semiconductor substrate, the second ILD layer extends into the second trench and seals a second air gap in the second trench, and at least a portion of the second air gap is below the top surface of the semiconductor substrate, the second ILD layer is along respective portions of the first ILD layer along the first semiconductor sidewall and the second semiconductor sidewall of the first trench, the first air gap only contacting the second ILD layer, a plane is parallel to the top surface and intersects sequentially the first semiconductor sidewall of the first trench, the portion of the first ILD layer contacting the first semiconductor sidewall of the first trench, a first portion of the second ILD layer, the first air gap, a second portion of the second ILD layer, the portion of the first ILD layer contacting the second semiconductor sidewall of the first trench, and the second semiconductor sidewall of the first trench, the first air gap has a first portion in the first portion of the first trench that forms a first full lateral ring around the first device and the second device, and the first air gap has a second portion in the second portion of the first trench and a third portion in the third portion of the first trench, the first portion of the first air gap, the second portion of the first air gap, and the third portion of the first air gap being contiguous, and the second air gap forms a second full lateral ring around the first trench; and a contact plug through the first ILD layer and the second ILD layer to the first source/drain region.

* * * * *

UNITED STATES PATENT AND TRADEMARK OFFICE
CERTIFICATE OF CORRECTION

| | | |
|---|---|---|
| PATENT NO. | : 9,269,609 B2 | Page 1 of 1 |
| APPLICATION NO. | : 13/486265 | |
| DATED | : February 23, 2016 | |
| INVENTOR(S) | : Hong-Seng Shue | |

It is certified that error appears in the above-identified patent and that said Letters Patent is hereby corrected as shown below:

Claims

In Col. 7, line 43, claim 2, delete "further comprising:"

Signed and Sealed this
Third Day of May, 2016

Michelle K. Lee
*Director of the United States Patent and Trademark Office*